US011014250B2

(12) United States Patent
Iwazaki et al.

(10) Patent No.: US 11,014,250 B2
(45) Date of Patent: May 25, 2021

(54) GRIPPING DEVICE AND ROBOT

(71) Applicant: Seiko Epson Corporation, Tokyo (JP)

(72) Inventors: Tomohisa Iwazaki, Shimosuwa (JP); Yutaka Arakawa, Hara (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/414,922

(22) Filed: May 17, 2019

(65) Prior Publication Data
US 2019/0351562 A1  Nov. 21, 2019

(30) Foreign Application Priority Data

May 18, 2018 (JP) .............................. JP2018-096228

(51) Int. Cl.
*B25J 15/08* (2006.01)
*B25J 15/02* (2006.01)
*H02N 2/10* (2006.01)

(52) U.S. Cl.
CPC ............. *B25J 15/08* (2013.01); *B25J 15/026* (2013.01); *H02N 2/103* (2013.01)

(58) Field of Classification Search
CPC .... B25J 15/0253; B25J 15/026; B25J 15/086; B25J 9/12; B25J 9/126; B25J 15/08; H02N 2/103; H01L 41/00; Y10S 901/38
USPC ....................................................... 294/119.1
See application file for complete search history.

(56) References Cited

U.S. PATENT DOCUMENTS

| 4,600,357 | A | * | 7/1986 | Coules | ................... | B25J 13/082 |
| | | | | | | 294/106 |
| 4,707,013 | A | * | 11/1987 | Vranish | ................... | B25J 15/026 |
| | | | | | | 294/119.1 |
| 4,808,898 | A | * | 2/1989 | Pearson | ................. | B25J 9/1015 |
| | | | | | | 294/119.1 |
| 5,080,415 | A | * | 1/1992 | Bjornson | ............... | B25J 15/103 |
| | | | | | | 294/119.1 |
| 7,663,292 | B2 | * | 2/2010 | Adachi | ................... | H02N 2/004 |
| | | | | | | 310/323.09 |
| 2012/0308355 | A1 | * | 12/2012 | Yasukawa | ............... | H02N 2/004 |
| | | | | | | 414/729 |
| 2013/0141716 | A1 | * | 6/2013 | Mizushima | ........... | H01L 41/053 |
| | | | | | | 356/244 |
| 2015/0343646 | A1 | * | 12/2015 | Drab | .................... | B25J 15/0028 |
| | | | | | | 294/207 |

(Continued)

FOREIGN PATENT DOCUMENTS

JP  2001-341091 A  12/2001

*Primary Examiner* — Dean J Kramer
(74) *Attorney, Agent, or Firm* — Harness, Dickey & Pierce, P.L.C.

(57) ABSTRACT

A gripping device includes a rotating member having a pinion and rotating about a center axis of the pinion, a drive piezoelectric unit having a vibrating portion that vibrates with expansion and contraction of a piezoelectric material, and a convex portion provided in the vibrating portion, being in contact with the rotating member, and transmitting vibration of the vibrating portion to the rotating member, a rack meshing with the pinion and moving with rotation of the pinion, and a gripping part coupled to the rack, wherein a contact portion in which the convex portion and the rotating member are in contact is located outside of an outer circumference of the pinion in a plan view from a direction of a rotation axis of the rotating member.

4 Claims, 9 Drawing Sheets

(56) References Cited

U.S. PATENT DOCUMENTS

2016/0114490 A1* 4/2016 Becker ................... B25J 15/026
  294/207
2016/0278872 A1* 9/2016 Gombert ................ A61B 34/72
2016/0284968 A1* 9/2016 Miyazawa ............. B25J 9/0087

* cited by examiner

GRIPPING DEVICE AND ROBOT

The present application is based on and claims priority from JP Application Serial Number 2018-096228, filed May 18, 2018, the disclosure of which is hereby incorporated by reference herein in its entirety.

BACKGROUND

1. Technical Field

The present disclosure relates to a gripping device and a robot.

2. Related Art

For example, a gripping device disclosed in JP-A-2001-341091 has a main body, a pair of gripping parts placed to be movable in parallel to the main body, an ultrasonic motor attached to the main body for moving the pair of gripping parts, a pinion provided on an output shaft of the ultrasonic motor, and a pair of racks meshing with the pinion, to which the gripping parts are fixed. In the gripping device, when the ultrasonic motor is driven to rotate the pinion, the pair of racks move in opposing directions, and thereby, the pair of gripping parts move closer to and away from each other.

However, in the gripping device in JP-A-2001-341091, the configuration of the ultrasonic motor is not clear, and the gripping force in the gripping parts may be insufficient depending on the configuration of the gripping device.

SUMMARY

A gripping device according to an aspect of the present disclosure includes a rotating member having a pinion, a drive unit having a vibrating portion in which a piezoelectric material vibrates, and a convex portion being in contact with the rotating member and transmitting the vibration to the rotating member, a rack meshing with the pinion and moving with rotation of the pinion, and a gripping part coupled to the rack, wherein a contact portion in which the convex portion and the rotating member are in contact is located outside of an outer circumference of the pinion in a plan view from a direction of a rotation axis of the rotating member.

DESCRIPTION OF EXEMPLARY EMBODIMENTS

As below, a gripping device and a robot of the present disclosure will be explained in detail based on preferred embodiments shown in the accompanying drawings.

First Embodiment

First, a gripping device according to the first embodiment of the present disclosure is described.

Figure 1:
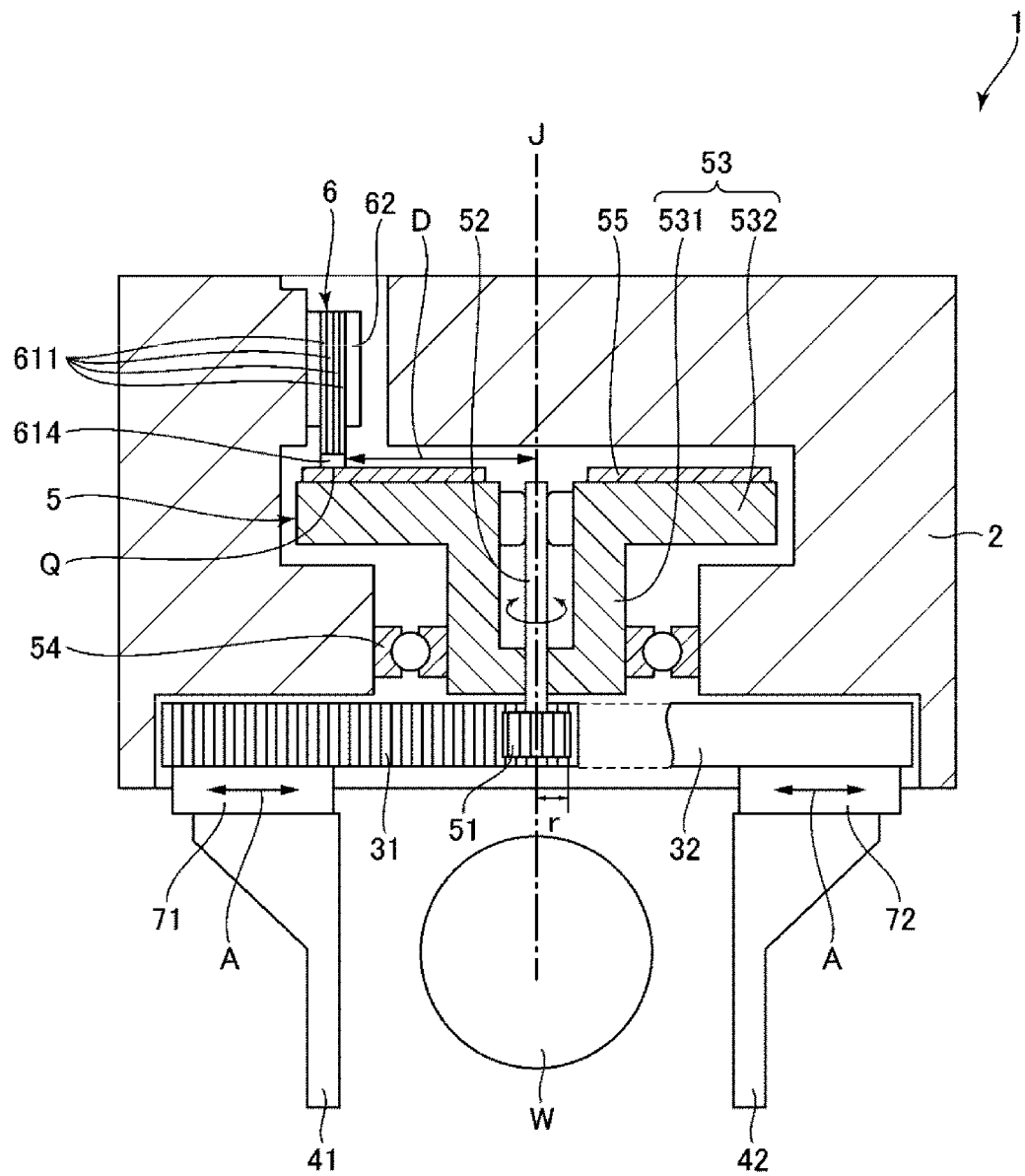
FIG. 1 is a sectional view showing a gripping device according to a first embodiment of the present disclosure.
Figure 2:
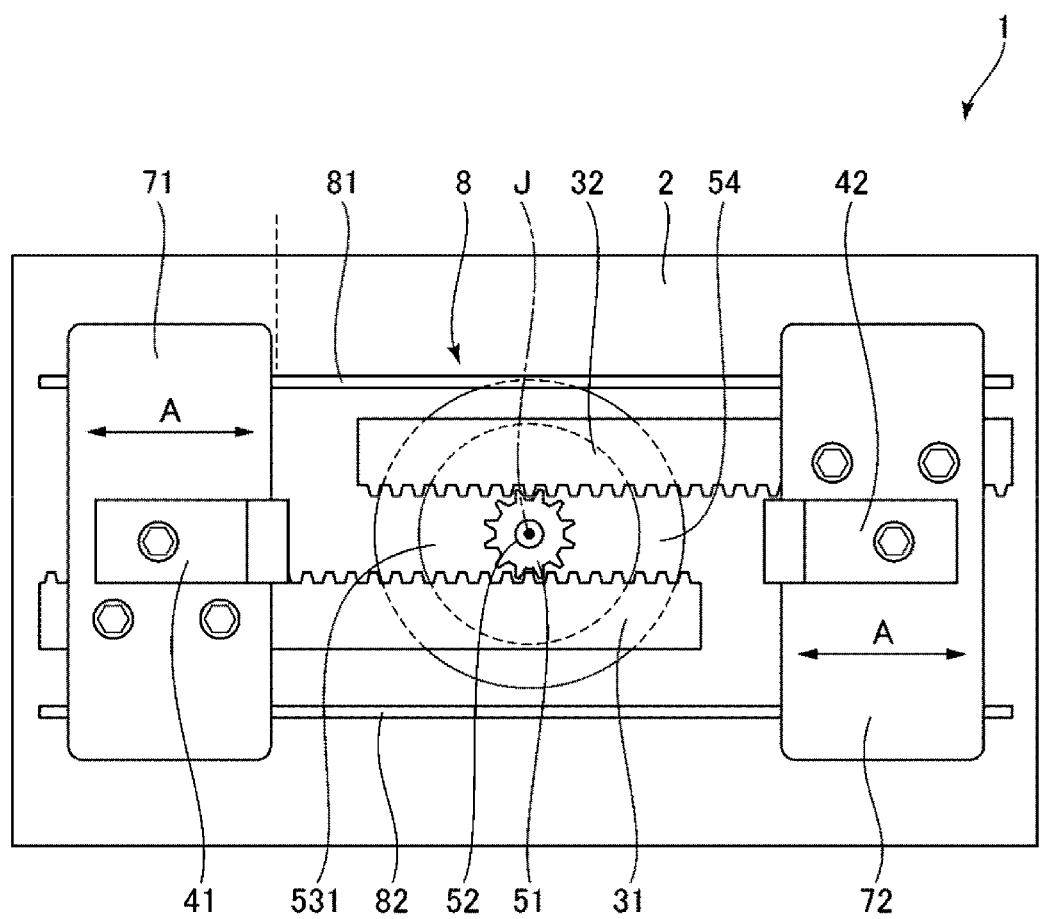
FIG. 2 is a plan view of the gripping device shown in FIG. 1.
Figure 3:
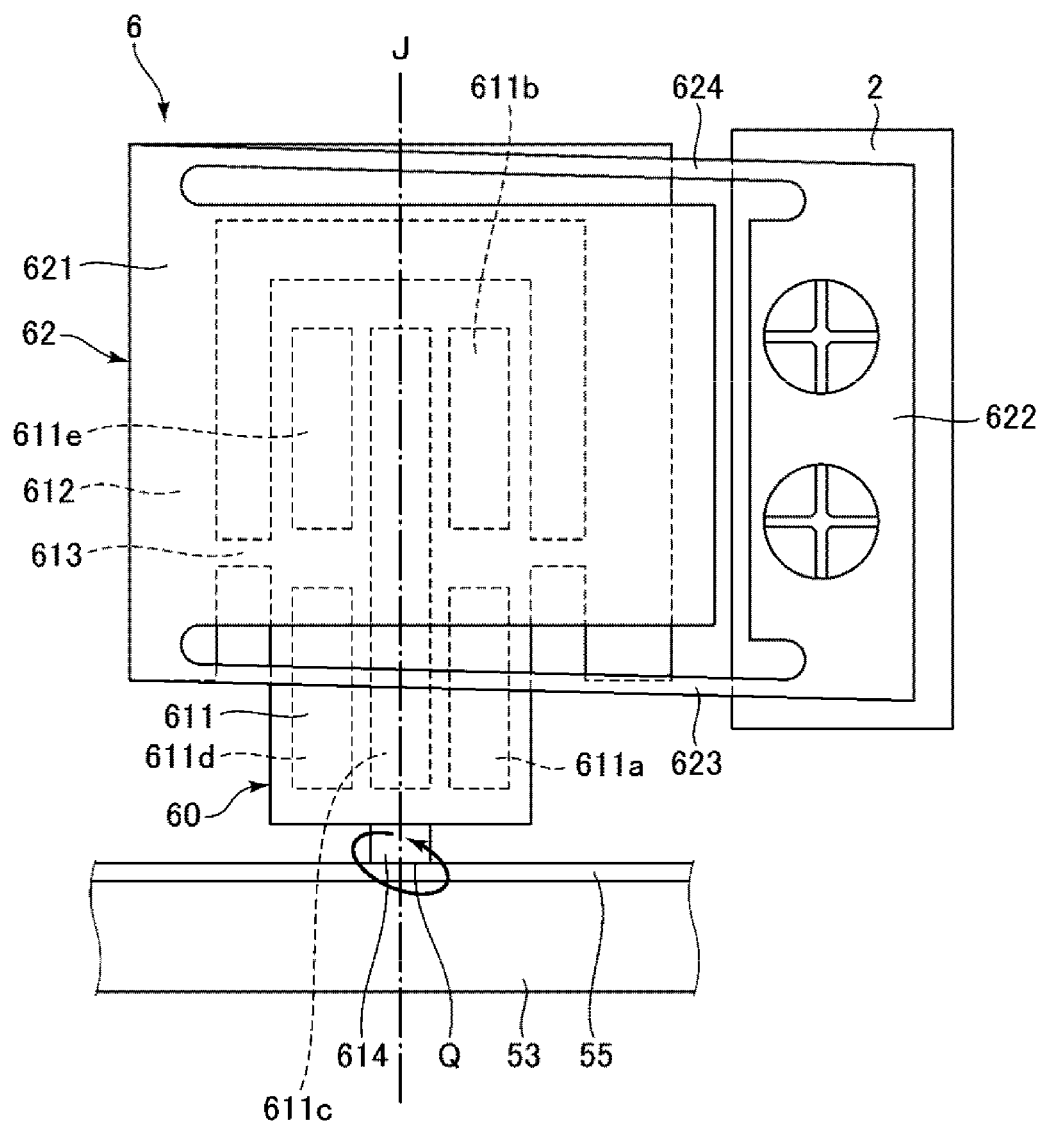
FIG. 3 is a plan view showing a piezoelectric motor of the gripping device shown in FIG. 1.
Figure 4:
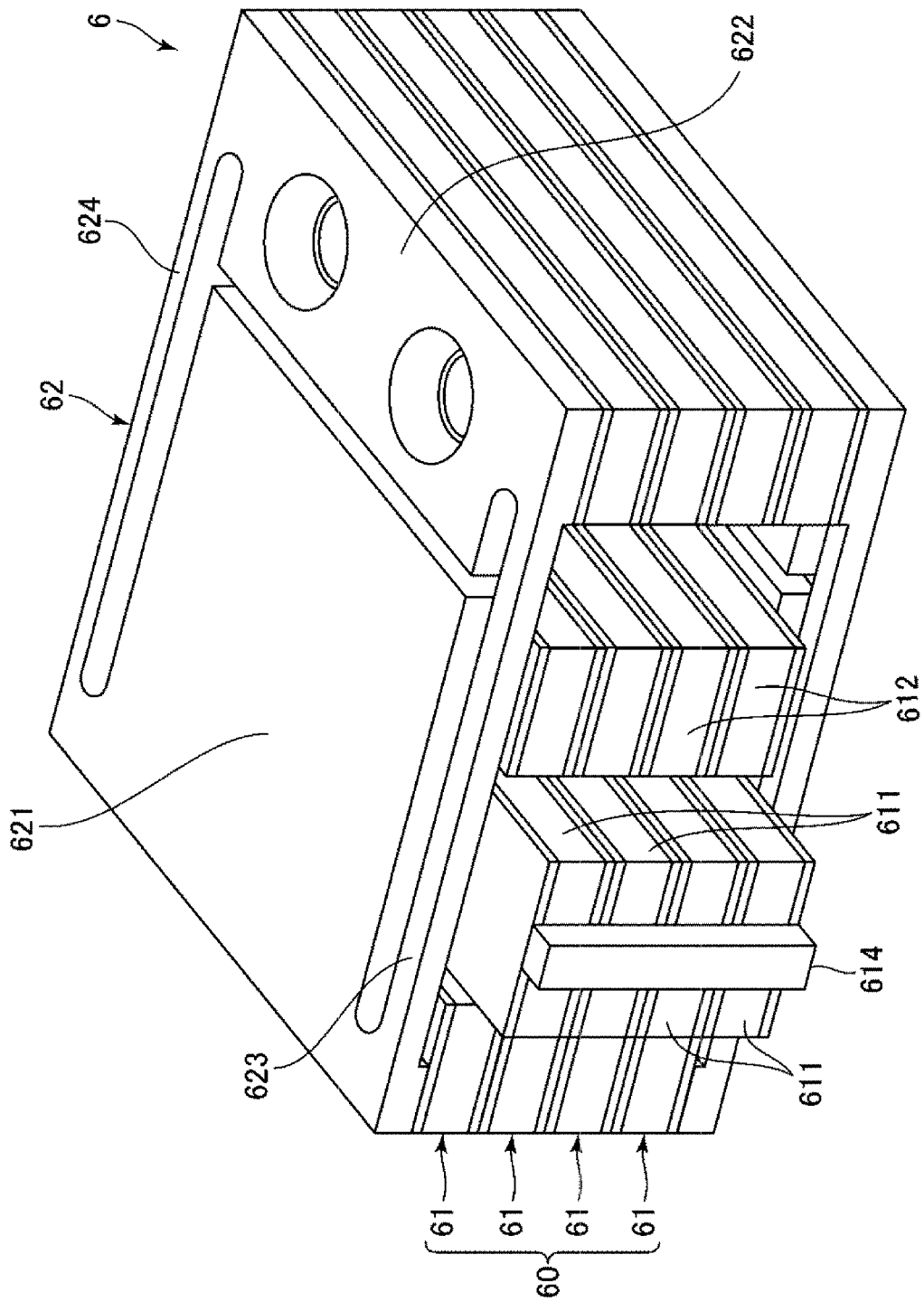
FIG. 4 is a perspective view of the piezoelectric motor shown in FIG. 3.
Figure 5:
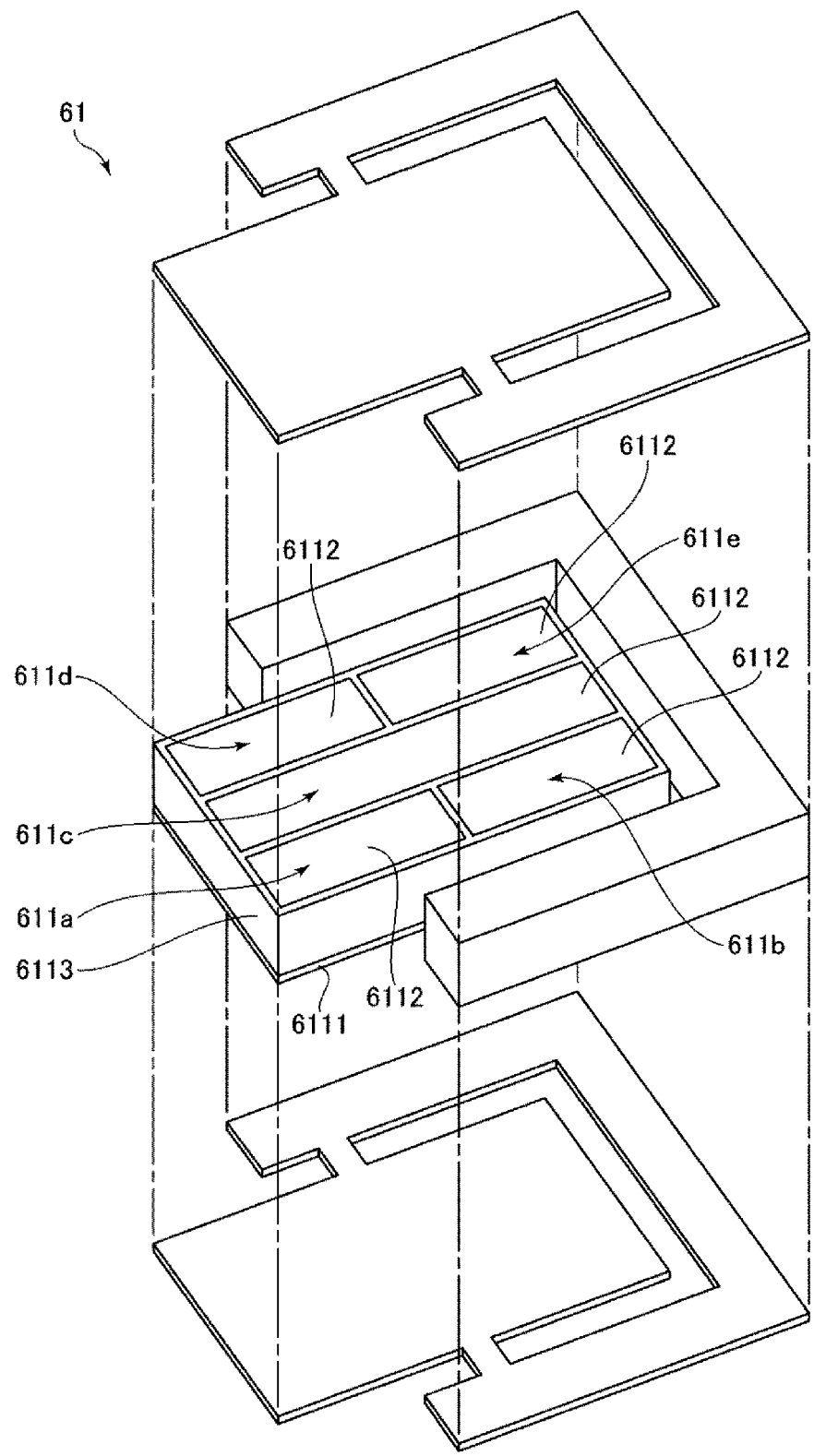
FIG. 5 is an exploded perspective view of a piezoelectric actuator of the piezoelectric motor shown in FIG. 3.

FIG. 1 is the sectional view showing the gripping device according to the first embodiment of the present disclosure. FIG. 2 is the plan view of the gripping device shown in FIG. 1. FIG. 3 is the plan view showing the piezoelectric motor of the gripping device shown in FIG. 1. FIG. 4 is the perspective view of the piezoelectric motor shown in FIG. 3. FIG. 5 is the exploded perspective view of the piezoelectric actuator of the piezoelectric motor shown in FIG. 3. Note that, hereinafter, for convenience of explanation, the upside in FIG. 1 is also referred to as "upper" and the downside is also referred to as "lower". Further, "orthogonal" in this specification includes not only the case where two axes or surfaces are orthogonal but also the cases where two axes or surfaces intersect in a range from 85° to 95°, for example. Furthermore, "parallel" in this specification includes not only the case where two axes or surfaces are parallel but also the cases where one inclines relative to the other in a range of ±5°, for example.

A gripping device 1 shown in FIG. 1 is e.g. a hand attached to a robot or the like and used and may grip an object W using two gripping parts 41, 42. The gripping device 1 has a base 2, a pair of sliders 71, 72 slidably supported relative to the base 2, a pair of racks 31, 32 (rack gears) fixed to the sliders 71, 72, respectively, and placed with teeth opposing to each other, the pair of gripping parts 41, 42 fixed to the racks 31, 32, a rotating member 5 having a pinion 51 (pinion gear) meshing with the racks 31, 32, a piezoelectric motor 6 as a piezoelectric drive unit that rotates the rotating member 5. Note that the piezoelectric motor 6 is fixed to the base 2.

As shown in FIG. 2, the sliders 71, 72 are respectively supported by the base 2 via a slide guide 8 including a pair of rails 81, 82 and slidable in directions of arrows A relative to the base 2. Further, the rack 31 extending in the directions of arrows A is fixed to the upper surface of the slider 71 and the gripping part 41 is fixed to the lower surface. Similarly, the rack 32 extending in the directions of arrows A is fixed to the upper surface of the slider 72 and the gripping part 42 is fixed to the lower surface. The pinion 51 meshing with the racks 31, 32 is provided between the racks 31, 32. Accordingly, when the pinion 51 rotates about a center axis J thereof, the racks 31, 32 slide in the directions of arrows A and opposite directions (opposing directions) to each other.

Note that, in the embodiment, the pitches of teeth of the racks 31, 32 are equal and the racks 31, 32 slide at an equal speed. Further, the racks 31, 32 slide symmetrically with respect to the center axis J, which will be described later. Accordingly, the object W may be gripped on the center axis J independent of the size of the object W.

As described above, the racks 31, 32 slide in the opposing directions and the gripping parts 41, 42 move closer to or away from each other, and thereby, the object W may be gripped or the gripped object W may be released by the gripping parts 41, 42.

Returning to FIG. 1, the rotating member 5 has the pinion 51 and a rotor 53 coupled to the pinion 51 via a shaft portion 52. Further, the pinion 51 and the rotor 53 are coaxially provided. The rotor 53 has a smaller diameter portion 531, and a larger diameter portion 532 in a circular disc shape (flange shape) located on the upper side of the smaller diameter portion 531. The rotor 53 is supported rotatably about the center axis J by the base 2 via a bearing 54 (rolling bearing) in the smaller diameter portion 531. Note that the bearing 54 is placed on the smaller diameter portion 531 and the outer diameter of the bearing 54 is smaller than the outer diameter of the larger diameter portion 532. Thereby, the gripping device 1 may be downsized. Further, the bearing 54 may be e.g. a thrust bearing placed to support the lower surface of the larger diameter portion 532.

A driven member 55 in contact with the piezoelectric motor 6 is provided on the upper surface of the larger diameter portion 532 of the rotor 53. The constituent material of the driven member 55 is not particularly limited, but preferably a material with good wear resistance. The material with good wear resistance includes e.g. various ceramics such as oxide ceramics including alumina, silica, titania, and zirconia, and nitride ceramics including silicon nitride, aluminum nitride, and titanium nitride, sapphire, and quartz crystal. Note that the driven member 55 may be omitted and the piezoelectric motor 6 may be in contact with the upper surface of the rotor 53.

As shown in FIGS. 3 and 4, the piezoelectric motor has a stacking structure 60 in which a plurality of piezoelectric actuators 61 are stacked, and an urging part 62 that urges the stacking structure 60 toward the driven member 55. Further, the urging part 62 has a supporting portion 621 that supports the stacking structure 60, a fixing portion 622 fixed with screws to the base 2, and a pair of spring portions 623, 624 coupling the supporting portion 621 and the fixing portion 622.

Each piezoelectric actuator 61 has a vibrating portion 611, a supporting portion 612 that supports the vibrating portion 611, a pair of coupling portions 613 coupling the vibrating portion 611 and the supporting portion 612, and a convex portion 614 provided in the distal end part of the vibrating portion 611 and transmitting drive force of the vibrating portion 611 to the driven member 55. The convex portion 614 is provided to project from the vibrating portion 611 and the distal end part thereof is pressed against the driven member 55 by the urging part 62 into contact with the upper surface of the driven member 55. It is preferable that the contact location of the convex portion 614 with the driven member 55 is in a position closer to the outer circumference of the larger diameter portion 532 from the center axis J. Thereby, sufficient rotation torque is obtained.

Further, piezoelectric elements 611a, 611b, 611c, 611d, 611e are provided in the vibrating portion 611. As shown in FIG. 5, the respective piezoelectric elements 611a to 611e have pairs of electrodes 6111, 6112 and piezoelectric materials 6113 sandwiched by the pairs of electrodes, and are expandable in the longitudinal direction of the vibrating portion 611. Further, the electrode 6111 is provided in common among the piezoelectric elements 611a to 611e, and the electrodes 6112 are divisionally provided in correspondence with the piezoelectric elements 611a to 611e. When predetermined drive signals are applied to these respective piezoelectric elements 611a to 611e, and thereby, the vibrating portion 611 performs longitudinal vibration as vibration in one axis direction and flexural vibration as vibration in S-shapes to make motion that the convex portion 614 draws an elliptical trajectory. The driven member 55 is moved out by the elliptical motion of the convex portion 614, and the rotating member 5 rotates (forward/backward) about the center axis J relative to the base 2. That is, the center axis J is a rotation axis of the rotating member 5.

Note that, while driving of the piezoelectric motor 6 is stopped, that is, the convex portion 614 stops the elliptical motion, the convex portion 614 is pressed against the driven member 55 by the urging part 62, and thus, the rotation of the rotating member 5 is blocked by the frictional force generated between the convex portion 614 and the driven member 55 and the position of the rotating member 5 is held. Therefore, according to the piezoelectric motor 6, the rotation of the rotating member 5 may be blocked only by stopping the driving of the motor without separately providing a braking mechanism.

As the constituent material of the piezoelectric material 6113, e.g. piezoelectric ceramics such as lead titanate zirconate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, and lead scandium niobate may be used. The piezoelectric material including the piezoelectric ceramics may be formed using e.g. the sol-gel method or sputtering method, or formed from a bulk material. Or, as the constituent material of the piezoelectric material 6113, not only the above described piezoelectric ceramics but also polyvinylidene fluoride, quartz crystal, or the like may be used.

Note that the configuration of the piezoelectric motor 6 is not particularly limited as long as the rotating member 5 may be rotated by the vibration of the vibrating portion 611. For example, in the embodiment, the stacking structure 60 in which the plurality of piezoelectric actuators 61 are stacked is used, however, the single piezoelectric actuator 61 may be used. Further, in the embodiment, the vibrating portion 611 performs in-plane vibration, however, the vibrating portion 611 may perform out-of-plane vibration, i.e., vibration in thickness directions.

In the embodiment, the single piezoelectric motor 6 is provided, however, the number of piezoelectric motors 6 is not particularly limited, but may be two or more. A plurality of the piezoelectric motors 6 are placed, and thereby, the rotating member 5 may be rotated with larger torque. Further, when the plurality of the piezoelectric motors 6 are placed, it is preferable that the plurality of the piezoelectric motors 6 are placed at equal angular intervals around the center axis J. Thereby, deflection of pressure as an urging force from the plurality of the piezoelectric motors 6 may be prevented and the rotating member 5 may be smoothly rotated. Moreover, interferences between the plurality of the piezoelectric motors 6 may be effectively reduced.

As shown in FIGS. 1 and 3, the direction in which the vibrating portion 611 and the convex portion 614 are arranged is along the center axis J. In other words, the longitudinal direction of the vibrating portion 611 is parallel to the center axis J. The piezoelectric motor 6 is placed in the posture, and thereby, the planar spread (spread in directions orthogonal to the center axis J) of the piezoelectric motor 6 may be suppressed. Accordingly, the gripping device 1 may be downsized.

Further, as shown in FIG. 1, the contact portion between the piezoelectric motor 6 and the rotating member 5, more specifically, a contact portion Q between the convex portion 614 and the driven member 55 shifts from the center axis J in the direction orthogonal to the center axis J. Since the torque of the piezoelectric motor 6 is larger as the contact portion Q is farther from the center axis J, the contact portion Q is shifted from the center axis J, and thereby, the rotating member 5 may be rotated with larger torque. Accordingly, the gripping force by the gripping parts 41, 42 may be made larger and the object W may be gripped more stably.

Particularly, in the embodiment, the contact portion Q is located outside of the outer circumference of the pinion 51 in a plan view from a direction along the center axis J. In other words, the contact portion Q does not overlap with the pinion 51 in the plan view from the direction along the center axis J. Accordingly, the contact portion Q may be set sufficiently far from the center axis J and the rotating member 5 may be rotated with larger torque. Accordingly, the gripping force by the gripping parts 41, 42 may be made larger and the object W may be gripped more stably.

Here, a reduction ratio (D/r) is determined by a separation distance D between the contact portion Q and the center axis J and a radius r of the pinion 51. For example, the separation distance D and the radius r are designed so that the reduction ration may be "5", and thereby, a gripping force five times the drive force of the piezoelectric motor 6 may be exerted. Note that the reduction ratio is not particularly limited, but preferably equal to or larger than "2", more preferably equal to or larger than "4", and even more preferably equal to or larger than "6". Thereby, the object W may be gripped by a sufficiently large gripping force.

As above, the gripping device 1 is explained. As described above, the gripping device 1 has the rotating member 5 having the pinion 51 and rotating about the center axis J of the pinion 51, the piezoelectric motor 6 as the piezoelectric drive unit having the vibrating portion 611 that vibrates with expansion and contraction of the piezoelectric material 6113, and the convex portion 614 provided in the vibrating portion 611, being in contact with the driven member 55 and transmitting the vibration of the vibrating portion 611 to the rotating member 5, the racks 31, 32 meshing with the pinion 51 and moving with the rotation of the pinion 51, and the gripping parts 41, 42 coupled to the racks 31, 32. Further, the contact portion Q between the convex portion 614 and the driven member 55 shifts from the center axis J. As described above, the contact portion Q is shifted from the center axis J, and thereby, the rotating member 5 may be rotated with larger torque. Accordingly, the gripping force by the gripping parts 41, 42 may be made larger and the object W may be gripped more stably.

Further, as described above, the direction in which the vibrating portion 611 and the convex portion 614 are arranged is along the center axis J. Thereby, the gripping device 1 may be downsized.

As described above, the contact portion Q between the convex portion 614 and the rotating member 5 is located outside of the outer circumference of the pinion 51 in the plan view from the direction along the center axis J. Thereby, the contact portion Q may be sufficiently separated from the center axis J and the rotating member 5 may be rotated with larger torque. Accordingly, the gripping force by the gripping parts 41, 42 may be made larger and the object W may be gripped more stably.

As described above, the gripping device 1 has the pair of racks 31, 32 meshing with the pinion 51, the pair of racks 31, 32 are placed with the teeth opposing to each other with the pinion 51 sandwiched therebetween and move in opposing directions (opposite direction to each other) with the rotation of the pinion 51. Thereby, even when the outer diameter of the pinion 51 is smaller, wobbling of the center axis J may be reduced compared to the case with the single rack and the rotating member 5 may be rotated with large torque. Further, the gripping parts 41, 42 coupled to the racks 31, 32 may be opened and closed, and the object W may be easily gripped by the gripping parts 41, 42.

Note that the gripping device 1 is not limited to the embodiment. For example, the gripping device 1 of the embodiment has the pair of racks 31, 32, however, one of the racks 31, 32 may be omitted. In this case, the gripping part to be provided on the omitted rack may be fixed to the base 2, or may be slidable relative to the base 2 by a different drive mechanism.

Second Embodiment

Figure 6:
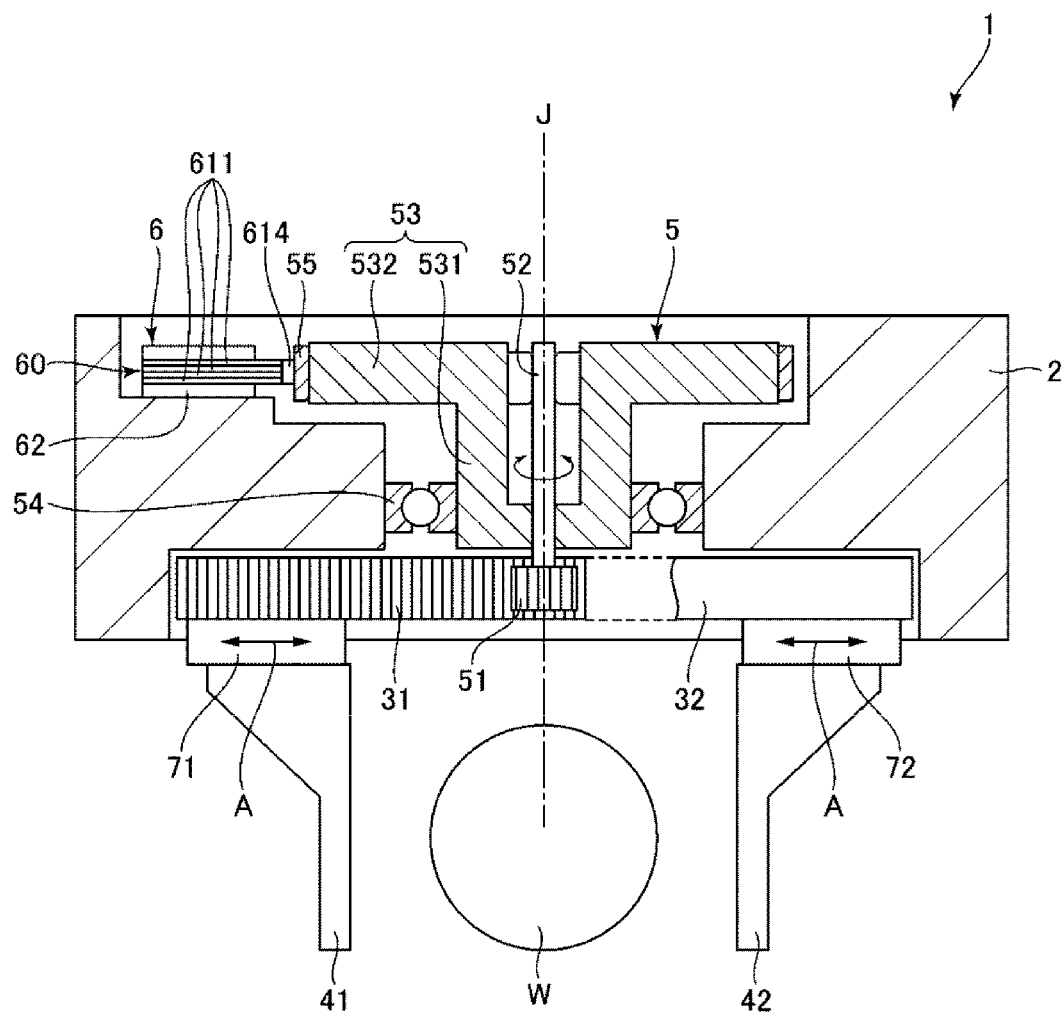
FIG. 6 is a sectional view showing a gripping device according to a second embodiment of the present disclosure.

FIG. 6 is the sectional view showing a gripping device according to the second embodiment of the present disclosure.

The gripping device 1 according to the embodiment is the same as the gripping device of the above described first embodiment except that the orientation of the piezoelectric motor 6 is different. Note that, in the following explanation, the gripping device 1 of the second embodiment will be explained with a focus on the differences from the above described first embodiment and the explanation of the same items will be omitted. Further, in FIG. 6, the same configurations as those of the above described embodiment have the same signs.

As shown in FIG. 6, in the gripping device 1 of the embodiment, the driven member 55 is placed on the outer circumferential surface of the larger diameter portion 532 of the rotor 53. Further, the convex portion 614 of the piezoelectric motor 6 is in contact with the outer circumferential surface of the driven member 55. The direction in which the vibrating portion 611 and the convex portion 614 are arranged is along the direction orthogonal to the center axis J. In other words, the longitudinal direction of the vibrating portion 611 is orthogonal to the center axis J. Further, the thickness direction of the vibrating portion 611 is along the center axis J. The piezoelectric motor 6 is placed in the posture, and thereby, for example, the height of the gripping device 1 may be made smaller than that of the above described first embodiment.

As describe above, in the gripping device 1 of the embodiment, the direction in which the vibrating portion 611 and the convex portion 614 are arranged is along the direction orthogonal to the center axis J. Thereby, the height of the gripping device 1 may be reduced.

Third Embodiment

Next, a gripping device according to the third embodiment of the present disclosure will be explained.

Figure 7:
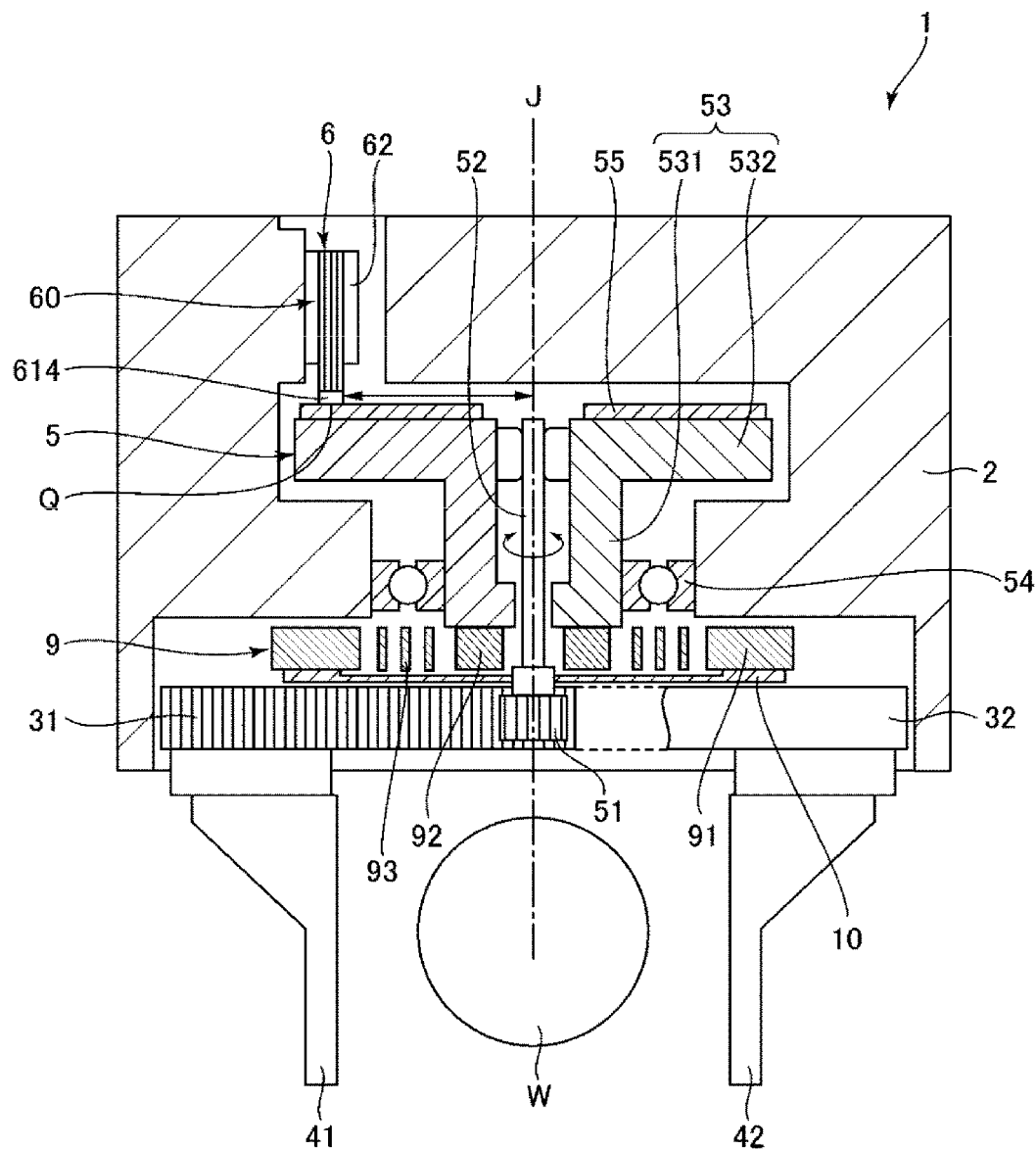
FIG. 7 is a sectional view of a gripping device according to a third embodiment of the present disclosure.
Figure 8:
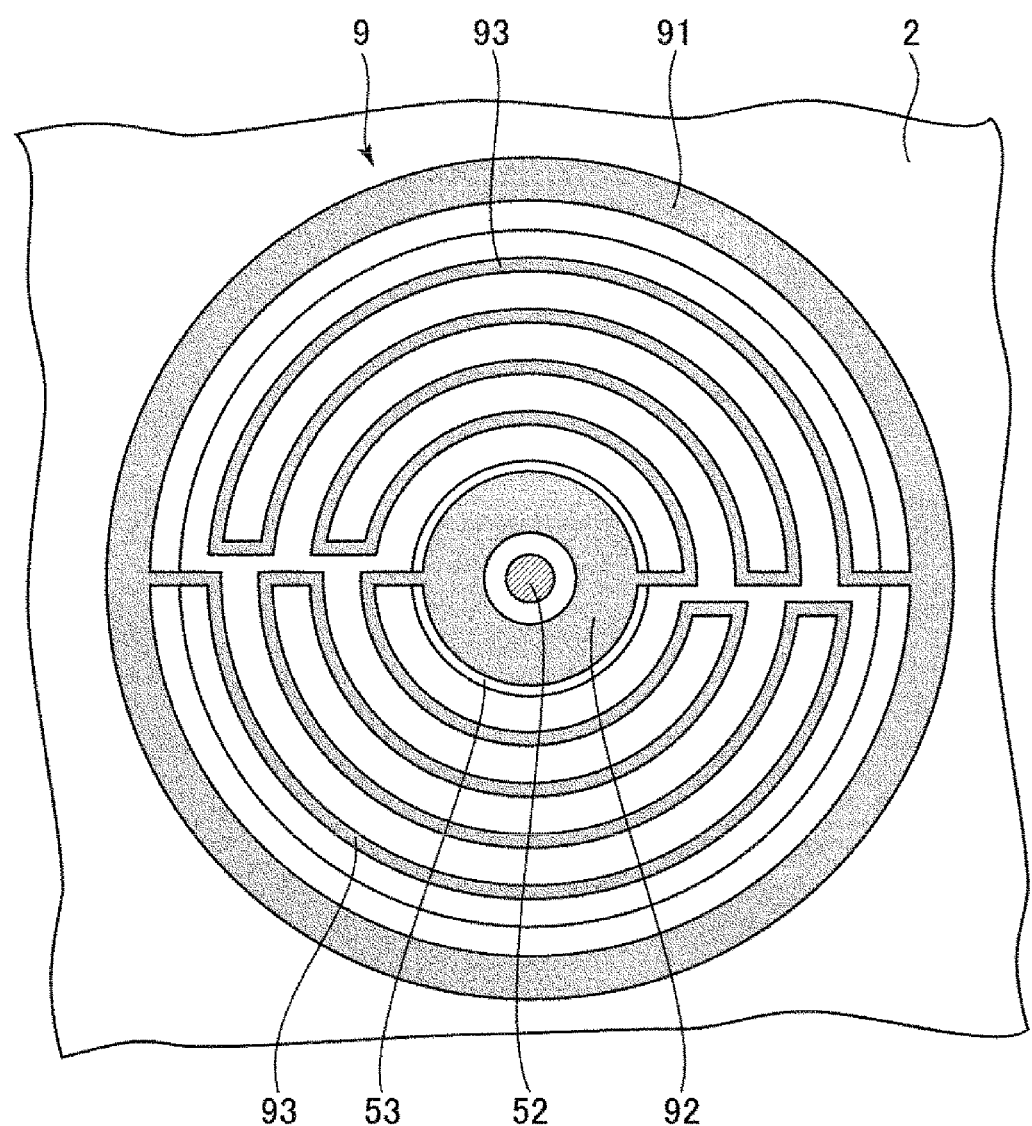
FIG. 8 is a plan view showing a rotary spring of the gripping device shown in FIG. 7.

FIG. 7 is the sectional view of the gripping device according to the third embodiment of the present disclosure. FIG. 8 is the plan view showing a rotary spring of the gripping device shown in FIG. 7.

The gripping device according to the embodiment is the same as the gripping device of the above described first embodiment except that a rotary spring 9 is further provided. Note that, in the following explanation, the gripping device 1 of the third embodiment will be explained with a focus on the differences from the above described first embodiment and the explanation of the same items will be omitted. Further, in FIGS. 7 and 8, the same configurations as those of the above described embodiment have the same signs.

As shown in FIG. 7, the gripping device 1 of the embodiment further has the rotary spring 9 coupling the rotor 53 and the base 2. As shown in FIG. 8, the rotary spring 9 has an outer fixing part 91 having an annular shape, an inner fixing part 92 located inside of the outer fixing part 91, and a spring part 93 located between the outer fixing part 91 and the inner fixing part 92 and coupling the fixing parts. The inner fixing part 92 is fixed to the rotor 53 (the lower surface of the smaller diameter portion 531), and the pinion 51 is fixed to the outer fixing part 91 via a coupling member 10. Note that, in the embodiment, the shaft portion 52 is rotatably supported relative to the rotor 53.

In the configuration, when the object W is gripped by the gripping parts 41, 42, the outer fixing part 91 is displaced about the center axis J relative to the inner fixing part 92 according to the gripping force thereof. Therefore, the gripping force may be calculated based on an amount of displacement (amount of rotation) of the outer fixing part 91. Accordingly, the amount of displacement of the outer fixing part 91 is controlled, and thereby, the force for gripping the object W may be controlled. Note that the amount of displacement of the outer fixing part 91 relative to the inner fixing part 92 may be detected using e.g. a rotary encoder or the like (not shown).

Even when the object W is gripped by the gripping parts 41, 42 and the gripping parts 41, 42 are hard to be closer, the rotor 53 may be rotated about the center axis J with elastic deformation of the rotary spring 9. Accordingly, the object W is gripped by the gripping parts 41, 42 and the rotor 53 is further rotated and the rotary spring 9 is elastically deformed, and thereby, the gripping force for the object W may be improved using a restoring force of the rotary spring 9. As a result, the object W may be gripped with a sufficient gripping force. As described above, the gripping force may be improved by elastic deformation of the rotary spring 9, and thus, while the object W is being gripped, the piezoelectric motor 6 may be stopped. That is, the rotary spring 9 is used, and thereby, the object W may be gripped with a sufficient gripping force without continuous driving of the piezoelectric motor 6 with the object W gripped. As described above, driving of the piezoelectric motor 6 is stopped, and thereby, friction of the convex portion 614 of the piezoelectric motor 6 and the driven member 55 may be reduced.

According to the third embodiment, the same effects as the above described first embodiment may be exerted. Note that, in the embodiment, the outer fixing part 91 is fixed to the base 2 and the inner fixing part 92 is fixed to the rotor 53, however, the inner fixing part 92 may be fixed to the base 2 and the outer fixing part 91 may be fixed to the rotor 53.

Fourth Embodiment

Next, a robot according to the fourth embodiment of the present disclosure will be explained.

Figure 9:
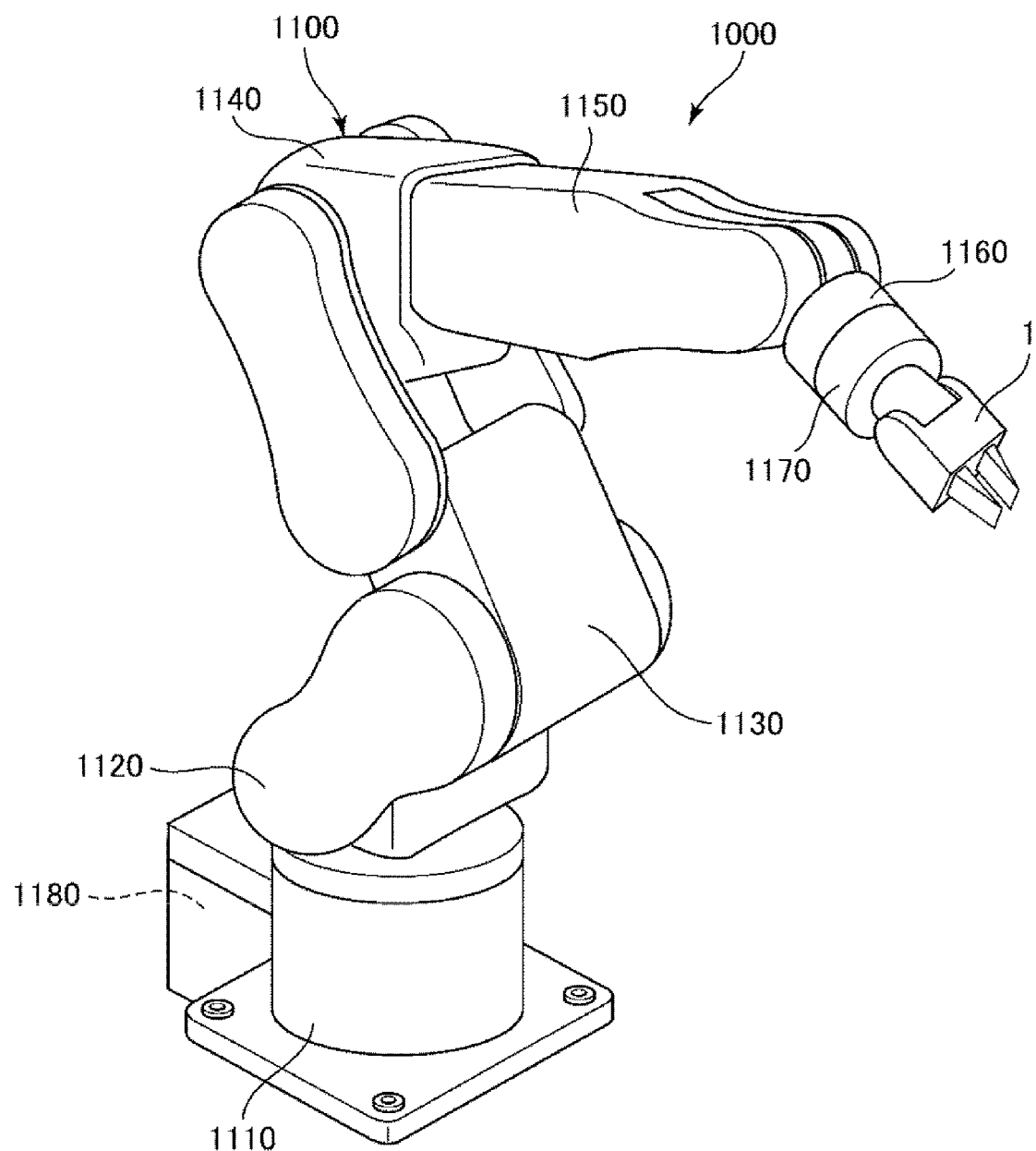
FIG. 9 is a perspective view showing a robot according to a fourth embodiment of the present disclosure.

FIG. 9 is the perspective view showing the robot according to the fourth embodiment of the present disclosure.

A robot 1000 shown in FIG. 9 may perform work of feeding, removing, carrying, assembly, etc. of precision apparatuses and components forming the apparatuses. The robot 1000 has a robot main body 1100 and the gripping device 1 attached to the robot main body 1100.

The robot main body 1100 is a six-axis robot, and has a base 1110 fixed to a floor or ceiling, an arm 1120 pivotably coupled to the base 1110, an arm 1130 pivotably coupled to the arm 1120, an arm 1140 pivotably coupled to the arm 1130, an arm 1150 pivotably coupled to the arm 1140, an arm 1160 pivotably coupled to the arm 1150, an arm 1170 pivotably coupled to the arm 1160, and a control apparatus 1180 that controls driving of these arms 1120, 1130, 1140, 1150, 1160, 1170. In the arm 1170, a hand coupling part is provided and, as an end effector according to the work to be executed by the robot main body 1100, e.g. the gripping device 1 of one of the above described first to third embodiments is attached to the hand coupling part.

As described above, the robot 1000 has the gripping device 1. Accordingly, the robot 1000 may enjoy the effects of the above described gripping device 1 and exert excellent reliability.

Note that the configuration of the robot 1000 is not particularly limited. For example, the number of arms may be one to five, seven, or more. Further, the robot 1000 may be a horizontal articulated robot (scalar robot) or dual-arm robot.

As above, the gripping device and the robot of the present disclosure are explained based on the illustrated embodiments, however, the present disclosure is not limited to those. The configurations of the respective parts may be replaced by arbitrary configurations having the same functions. Further, another arbitrary configuration may be added to the present disclosure. Furthermore, the respective embodiments may be appropriately combined.

What is claimed is:
1. A gripping device comprising:
a base;
a rotor having an annular plate including a first major planar surface and an opposing second major planar surface, a hollow cylindrical projection extending outward from the second major planar surface;
a pinion received within and fixed to the hollow cylindrical projection;
a rotary spring that couples the rotor and the base;
a drive unit having a vibrating portion in which a piezoelectric material vibrates, and a convex portion being in contact with the first major planar surface of the annular plate and transmitting the vibration to first planar major surface of the annular plate to rotate the rotor;
a rack meshing with the pinion and moving with rotation of the pinion; and
a gripping part coupled to the rack,
wherein a contact portion in which the convex portion and the first major planar surface of the annular plate are in contact is located outside of an outer circumference of the pinion in a plan view from a direction of a rotation axis of the annular plate.
2. The gripping device according to claim 1, wherein a direction in which the vibrating portion and the convex portion are arranged is along the rotation axis.
3. The gripping device according to claim 1, wherein a plurality of the racks are provided, and the plurality of racks are placed with teeth opposing to each other.
4. A robot comprising the gripping device according to claim 1.

* * * * *